(12) United States Patent
Feng et al.

(10) Patent No.: US 7,525,304 B1
(45) Date of Patent: Apr. 28, 2009

(54) MEASUREMENT OF EFFECTIVE CAPACITANCE

(75) Inventors: Yiping Feng, Cupertino, CA (US); Jianou Shi, Milpitas, CA (US); Xiafang Zhang, San Jose, CA (US)

(73) Assignee: KLA-Tencor Corporation, San Jose, CA (US)

( * ) Notice: Subject to any disclaimer, the term of this patent is extended or adjusted under 35 U.S.C. 154(b) by 86 days.

(21) Appl. No.: 11/748,207

(22) Filed: May 14, 2007

(51) Int. Cl.
*G01R 31/28* (2006.01)
*G01R 31/26* (2006.01)

(52) U.S. Cl. .................................. 324/158.1; 324/765

(58) Field of Classification Search .............. 324/158.1, 324/519, 658–660, 663; 438/14–17; 257/48
See application file for complete search history.

(56) References Cited

U.S. PATENT DOCUMENTS

| | | | | |
|---|---|---|---|---|
| 6,078,016 A | * | 6/2000 | Yoshikawa et al. | 200/181 |
| 6,403,389 B1 | * | 6/2002 | Chang et al. | 438/18 |
| 6,930,324 B2 | * | 8/2005 | Kowalski et al. | 257/48 |
| 6,967,499 B1 | * | 11/2005 | Haase et al. | 324/766 |
| 7,355,201 B2 | * | 4/2008 | Zhu et al. | 257/48 |
| 2006/0267593 A1 | * | 11/2006 | Ichimura et al. | 324/452 |
| 2007/0296444 A1 | * | 12/2007 | Zhu et al. | 324/765 |

* cited by examiner

*Primary Examiner*—Ha Tran T Nguyen
*Assistant Examiner*—Joshua Benitez
(74) *Attorney, Agent, or Firm*—Luedeka, Neely & Graham, P.C.

(57) ABSTRACT

A method for determining an effective capacitance of a dielectric material, by forming first and second asymmetrical electrodes entirely within a field of the dielectric material, where the first electrode, the second electrode, and the field of the dielectric material are co-planar, neither the first electrode nor the second electrode are either electrically connected to ground or to each other, applying a first charge Q on the first electrode, measuring a first voltage change $V_1$ on the first electrode, measuring a second voltage change $V_2$ on the second electrode, depositing a second charge Q' on the second electrode, measuring a third voltage change $V_3$ on the first electrode, measuring a fourth voltage change $V_4$ on the second electrode, calculating a first ground capacitance $C_{g1}$ by $C_{g1}=(V_2Q'-V_4Q)/(V_2V_3-V_1V_4)$, calculating a second ground capacitance Cg2 by $C_{g2}=(V_3Q-V_1Q')/(V_2V_3-V_1V_4)$, and calculating an inter-electrode capacitance $C_{ie}$ by $C_{ie}=V_3C_{g1}/(V_4-V_3)=V_2C_{g2}/(V_1-V_2)$.

25 Claims, 3 Drawing Sheets

MEASUREMENT OF EFFECTIVE CAPACITANCE

FIELD

This invention relates to the field of integrated circuit fabrication. More particularly, this invention relates to a method for in-line testing of field capacitance in integrated circuit structures.

BACKGROUND

As integrated circuits have continued to shrink in size, structures and materials that once were adequate for certain purposes, have become inadequate for their designated purposes. As the term is used herein, "integrated circuit" includes devices such as those formed on monolithic semiconducting substrates, such as those formed of group IV materials like silicon or germanium, or group III-V compounds like gallium arsenide, or mixtures of such materials. The term includes all types of devices formed, such as memory and logic, and all designs of such devices, such as MOS and bipolar. The term also comprehends applications such as flat panel displays, solar cells, and charge coupled devices.

For example, the small-featured traces and other electrically conductive structures of integrated circuits need to be adequately electrically insulated one from another. As feature size has decreased, and circuit speeds have increased, the dielectric materials used for electrical isolation are not adequate for the task, and tend to exhibit capacitance and other effects between the electrically conductive features. These effects tend to induce cross-talk and slow the switching speeds of the circuits.

To resolve issues such as these, new dielectric materials with lower capacitance values—so-called low-k materials—have been used in the fabrication of integrated circuits. Unfortunately, after these materials are deposited, subsequent processing of the integrated circuit might alter the capacitance of these low-k materials. For example, the effective k value of low-k films has been observed to change after etching and ashing processes.

Capacitance is traditionally tested in a final test of electrical parameters at the end of the fabrication cycle. However, it can take up to a month or more to complete the fabrication process and perform the tests. If the issues described above in regard to effective k value or uniformity are detected, the substrates bearing the integrated circuits having the problem may need to be scrapped, possibly along with all of the other substrates that are in the line.

What is needed, therefore, is a system that overcomes problems such as those described above, at least in part.

SUMMARY

The above and other needs are met by a method for determining an effective capacitance of a dielectric material, by forming first and second asymmetrical electrodes entirely within a field of the dielectric material, where the first electrode, the second electrode, and the field of the dielectric material are co-planar, neither the first electrode nor the second electrode are either electrically connected to ground or to each other, applying a first charge Q on the first electrode, measuring a first voltage change $V_1$ on the first electrode, measuring a second voltage change $V_2$ on the second electrode, depositing a second charge Q' on the second electrode, measuring a third voltage change $V_3$ on the first electrode, measuring a fourth voltage change $V_4$ on the second electrode, calculating a first ground capacitance $C_{g1}$ by $C_{g1}=(V_2Q'-V_4Q)/(V_2V_3-V_1V_4)$, calculating a second ground capacitance Cg2 by $C_{g2}=(V_3Q-V_1Q')/(V_2V_3-V_1V_4)$, and calculating an inter-electrode capacitance $C_{ie}$ by $C_{ie}=V_3C_{g1}/(V_4-V_3)=V_2C_{g2}/(V_1-V_2)$.

According to another embodiment of the invention, there is described a method for determining an in-plane effective capacitance of a dielectric material, by forming first and second symmetrical electrodes entirely within a field of the dielectric material, where the first electrode, the second electrode, and the field of the dielectric material are co-planar, neither the first electrode nor the second electrode are either electrically connected to ground or to each other, applying a first charge Q on the first electrode, measuring a first voltage change $V_1$ on the first electrode, measuring a second voltage change $V_2$ on the second electrode, calculating a ground capacitance $C_g$ by $C_g=Q/(V_1+V_2)$, and calculating an inter-electrode capacitance $C_{ie}$ by $C_{ie}=V_2Q/(V_1^2-V_2^2)$.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein.

DETAILED DESCRIPTION

Figure 1:
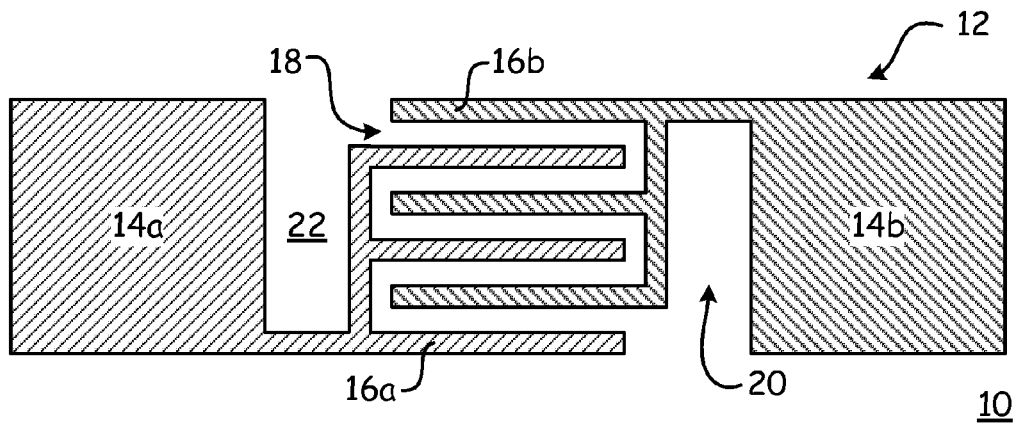
FIG. 1 is a top plan view of a test structure according to a first embodiment of the present invention.

The various embodiments of the present invention use a new test structure and method to measure effective capacitance or k value. This is accomplished with a planar structure, rather than with a standard stacked structure that is typically used for capacitance measurement or charge storage, where a dielectric layer is deposited between an overlying electrically conductive layer and an underlying electrically conductive layer. Instead, the planar test structure 12 described herein, as depicted in FIG. 1, is formed as a portion of an integrated circuit 10, or a test circuit, in a field 22 of the dielectric material to be tested. The dielectric film can be one or more of silicon oxide, silicon nitride, silicon carbide, metal oxide, carbon doped oxide, porous ultra-low-k film, spin-on polymer low-k film, SiLk, nanoglass, and MSQ low-k films.

Figure 4:
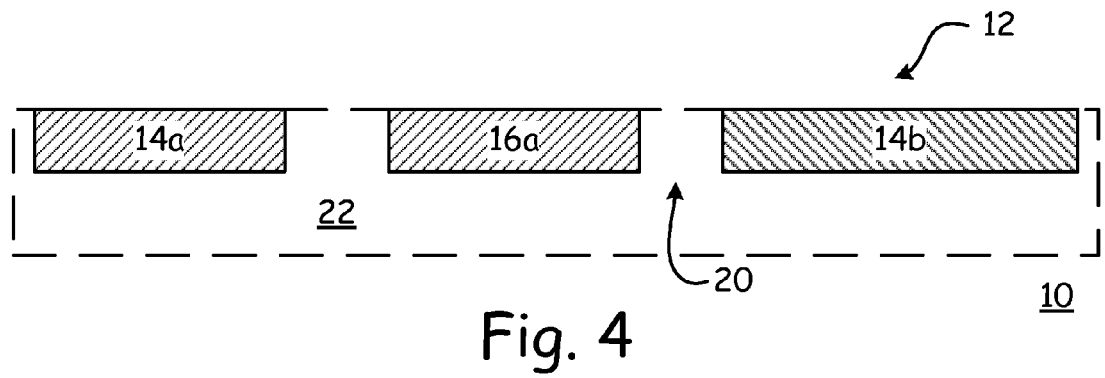
FIG. 4 is a cross-sectional side view of a test structure according to a second embodiment of the present invention.

As depicted in FIG. 4, the structure 12 is preferably entirely formed within a layer of the low-k material 22. For example, the layer of low-k material 22 can be formed on the surface of an integrated circuit 10, and then a portion of the low-k material 22 can be etched away, and the electrically conductive material of the structure 12 can be deposited, either just in the etched portions of the low-k material 22, or in both the etched portions and also over the entire surface of the low-k material 22. If formed over the entire surface, the electrically conductive material from which the structure 12 is formed can be removed so as to remain in only the etched portions of the layer 22. For example, a polishing step could be performed, which would form a top surface as depicted in FIG. 4. In one embodiment, the material used for the structure 12 is copper. After being formed, the structure 12 could be used immediately, as described below, or used at any point in the rest of the fabrication cycle thereafter.

The structure 12 preferably has at least one first pad 14a and at least one second pad 14b. These pads are connected to finger structures 16a and 16b, respectively. The finger structures 16a and 16b are interlaced, or in other words interdigitated, so as to alternate one finger 16a, then one finger 16b, then another finger 16a, and then another finger 16b, and so forth. The number of fingers 16a and 16b as depicted in FIG. 1 is by way of example only, and in actual implementation, there may be far more fingers 16a and 16b than depicted.

Figure 2:
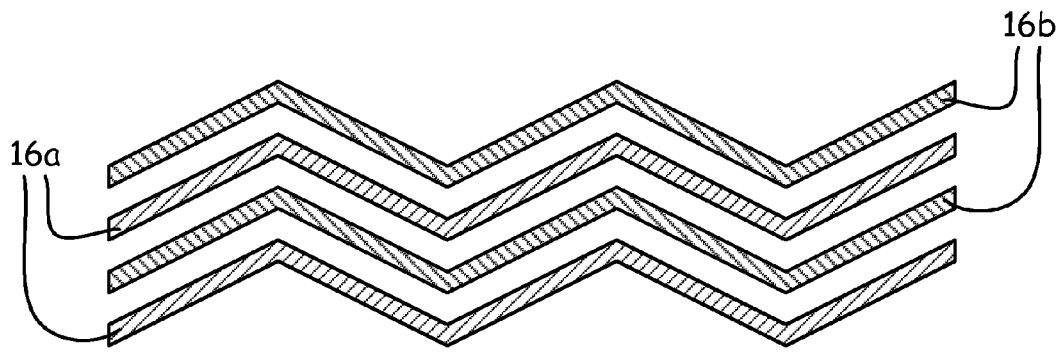
FIG. 2 is a top plan view of finger structures according to a second embodiment of the present invention.
Figure 3:
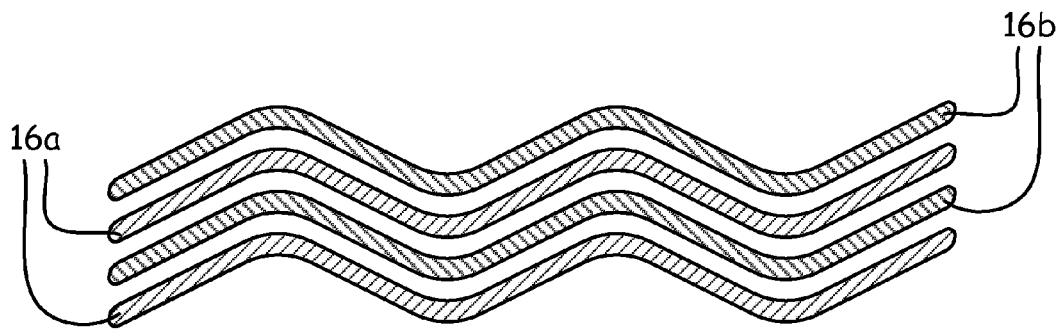
FIG. 3 is a top plan view of finger structures according to a third embodiment of the present invention.

Further, the configuration of the fingers 16a and 16b as depicted in FIG. 1 is also by way of example and not limitation. For example, the fingers 16a and 16b may be formed in a zigzag configuration, such as depicted in FIG. 2, or in a meandering pattern, as depicted in FIG. 3. Thus, there are many different configurations contemplated for the fingers 16a and 16b. In some embodiments the fingers 16a and 16b have a line width of about one-tenth of a micron, and are separated by a width 18 of the low-k material of about one-tenth of a micron. This distance 18 between the fingers 16a and 16b is called the critical dimension herein, which is used as described in more detail hereafter. The pads 14a and 14b are preferably offset from the fingers 16a and 16b by a field 20 of the low-k material, with a width of about ten microns.

The fingers 16a and 16b have, in one embodiment, a length of about fifty microns, and form fields of low-k material 22 that also have lengths of about fifty microns. In one embodiment, the pads 14a and 14b are symmetrical, meaning that the pad or pads 14a are the same size and the same number as the pad or pads 14b. In one embodiment, there is one pad 14a that is about fifty microns by about fifty microns square, and one pad 14b that is about fifty microns by about fifty microns square. This would be a symmetrical configuration, as depicted in FIG. 1.

Figure 5:
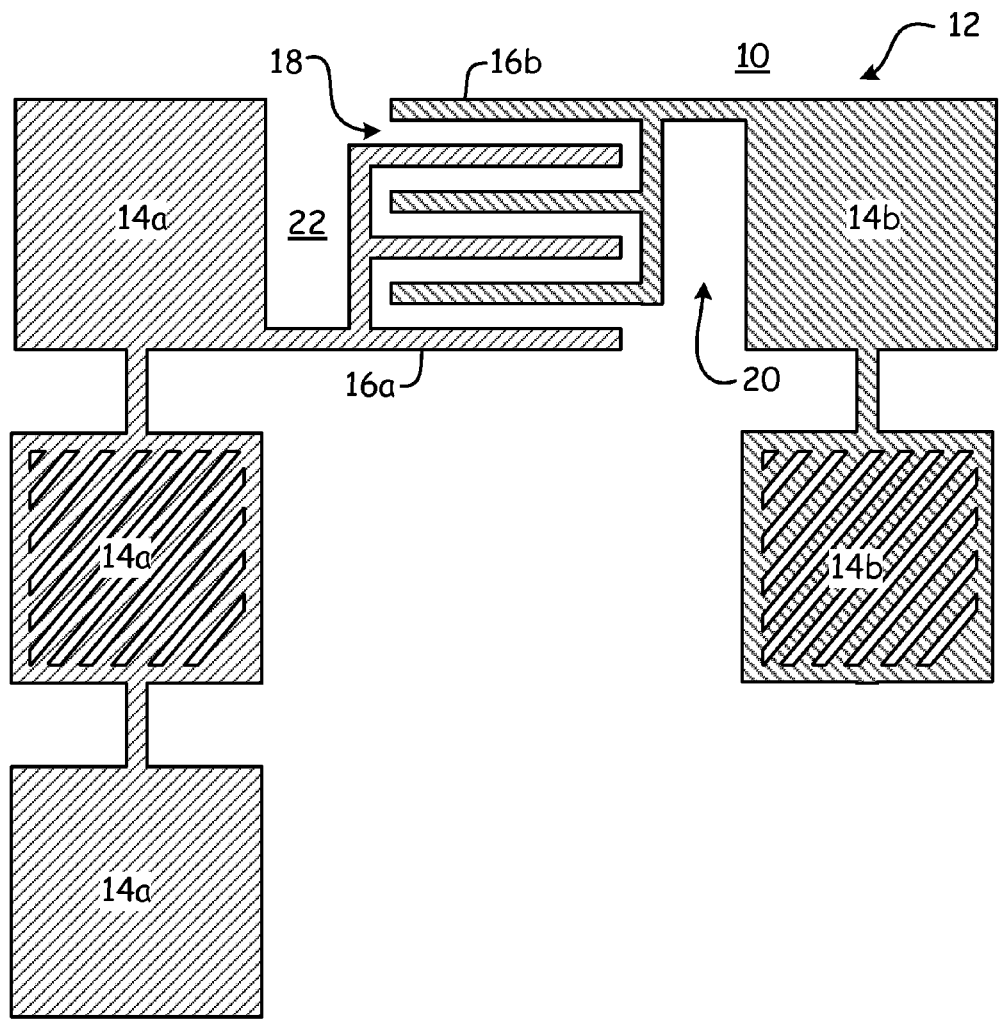
FIG. 5 is a top plan view of a test structure according to a second embodiment of the present invention.

An asymmetrical configuration is one in which there are a different number of pads 14a and 14b, or the same number of pads, but the pads are of different sizes, or both. If the surface area of the pad or pads 14a is more than insignificantly different than the surface area of the pad or pads 14b, then it is an asymmetrical configuration. The structure 12 depicted in FIG. 5 is asymmetrical, for example, because even though the pads 14a and 14b are of the same size, there are fewer pads 14b than there are pads 14a. The embodiment depicted in FIG. 4 is also an asymmetrical embodiment, because the pad 14a is smaller than the pad 14b. The importance of this designation is described with more detail hereafter. FIG. 5 also depicts some of the pads 14a and 14b being solid pads, and some of the pads 14a and 14b being slotted pads.

Figure 6:
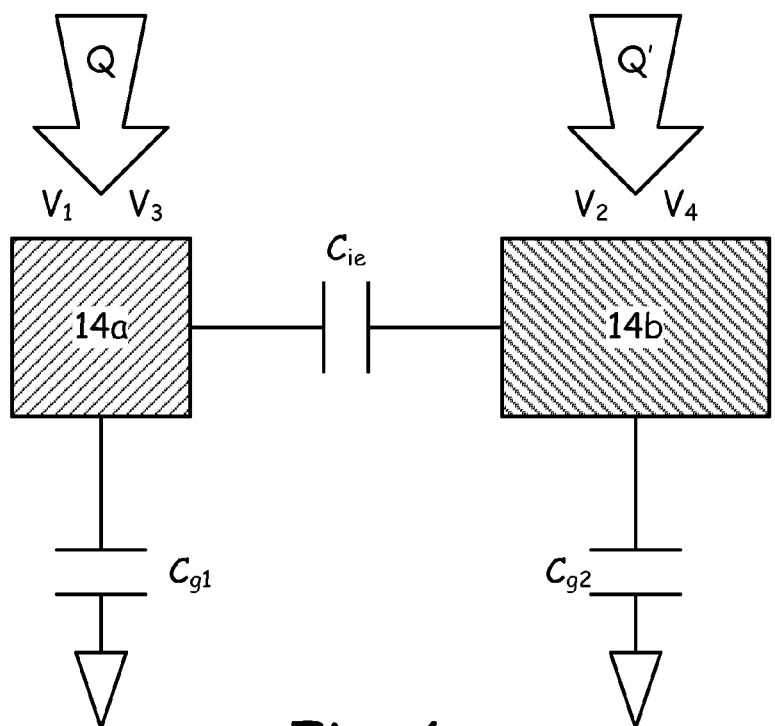
FIG. 6 is a schematic representation of the circuit and test method according to the second embodiment of the present invention.
Figure 7:
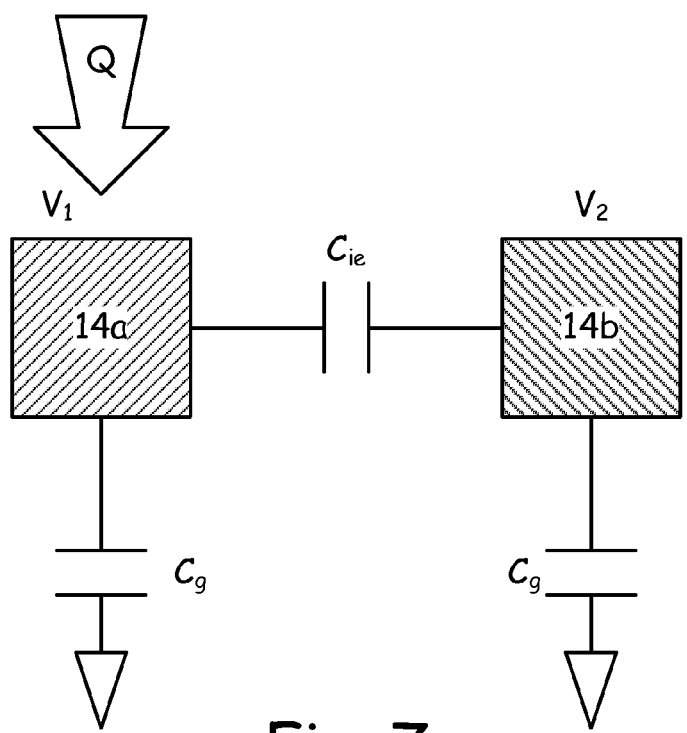
FIG. 7 is a schematic representation of the circuit and test method according to the first embodiment of the present invention.

FIGS. 6 and 7 depict schematic diagrams of and the methods of using an asymmetrical configuration (FIG. 6) and a symmetrical configuration (FIG. 7). With reference now to the symmetrical configuration of FIG. 7, a differential charge Q is applied to one or the other of the pads 14a and 14b, and a first differential voltage $V_1$ is measured at one of the pads 14a, and a second differential voltage $V_2$ is measured at the other of the pads 14b. The so-called ground capacitance $C_g$ is calculated by $C_g=Q/(V_1+V_2)$, and the so-called inter-electrode capacitance $C_{ie}$ is calculated by $C_{ie}=V_2Q/(V_1^2-V_2^2)$.

With reference now to the asymmetrical configuration of FIG. 6, a first differential charge Q is applied to pad 14a, and a first differential voltage V1 is measured at that same pad 14a, and a second differential voltage V2 is measured at the other pad 14b. Then a second differential charge Q' is applied at the other pad 14b, and a third differential voltage V3 is measured at the first pad 14a, and a fourth differential voltage V4 is measure at the other pad 14b. A first ground capacitance $C_{g1}$ is calculated by $C_{g1}=(V_2Q'-V_4Q)/(V_2V_3-V_1V_4)$. A second ground capacitance Cg2 is calculated by $C_{g2}=(V_3Q-V_1Q')/(V_2V_3-V_1V_4)$, and an inter-electrode capacitance $C_{ie}$ is calculated by $C_{ie}=V_3C_{g1}/(V_4-V_3)=V_2C_{g2}/(V_1-V_2)$. Because the procedure and the calculations used to determine the capacitances varies according to whether the structure 12 is symmetrical or asymmetrical, the proper designation of the structure 12 as one or the other is relatively important.

An effective k value for the material 22 in either case, be it symmetrical or asymmetrical, can be calculated from the capacitance values as derived above, and the critical dimension $C_d$ 18 between the fingers 16a and 16b of the structure 12, as described above. Thus, a planar structure 12 has been described that can be used as soon as it is formed, and at any time thereafter, to measure the effective k value of a field of dielectric material 22.

The charges Q and Q' can be applied in a variety of different ways, be they direct-contact or non-contact. Similarly, the differential voltages can be sensed in a variety of different ways, be they direct-contact or non-contact. For example, the charges Q and Q' can be applied using non-contact corona-based micro QV technology. The charges Q and Q' can also be applied using an electron beam or ion beam. The voltages can be sensed using the same technologies. Of course, the charges can be applied and voltages can be measured using direct contact methods, such as physical probes. The voltages can also be measured using a work function sensor that is at least one of a Kelvin probe, a Monroe probe, an electrostatic force probe, and an atomic force measurement probe. The voltages can be measured at frequencies from about zero kilohertz to about one kilohertz.

Multiple voltage measurements can be made for each of the voltage measurements $V_1$, $V_2$, $V_3$, and $V_4$, and then the multiple readings for each value can be distilled to a single value in a variety of different ways, such as by averaging the multiple readings. For example, eight readings can be taken for $V_1$, and then the eight readings added together to form a total, which is then divided by eight to determine the final value that is used for $V_1$. Other methods could also be used to collect data and discard or otherwise reduce the effect of erroneous data points.

The foregoing description of preferred embodiments for this invention has been presented for purposes of illustration and description. It is not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A method for determining an effective capacitance of a dielectric material, the method comprising the steps of:

forming first and second asymmetrical electrodes entirely within a field of the dielectric material, where the first electrode, the second electrode, and the field of the dielectric material are co-planar, neither the first electrode nor the second electrode are either electrically connected to ground or to each other, applying a first charge Q on the first electrode, measuring a first voltage change $V_1$ on the first electrode, measuring a second voltage change $V_2$ on the second electrode, depositing a second charge Q' on the second electrode, measuring a third voltage change $V_3$ on the first electrode, measuring a fourth voltage change $V_4$ on the second electrode, calculating a first ground capacitance $C_{g1}$ by, $$C_{g1}=(V_2 Q'-V_4 Q)/(V_2 V_3 - V_1 V_4),$$

calculating a second ground capacitance Cg2 by, $$C_{g2}=(V_3 Q - V_1 Q')/(V_2 V_3 - V_1 V_4), \text{ and}$$

calculating an inter-electrode capacitance $C_{ie}$ by, $$C_{ie}=V_3 C_{g1}/(V_4-V_3)=V_2 C_{g2}/(V_1-V_2).$$

2. The method of claim 1, wherein the first electrode includes first finger structures and the second electrode includes second finger structures, where the first finger structures interlace with but do not touch the second finger structures.

3. The method of claim 1, wherein the first electrode includes first finger structures and the second electrode includes second finger structures, where the first finger structures interlace with but do not touch the second finger structures, and there is a critical dimension $C_d$ of the dielectric material between the interlaced first finger structures and second finger structures, and further comprising the step of calculating an effective capacitance $C_e$ based at least in part on $C_{ie}$ and $C_d$.

4. The method of claim 3, wherein the critical dimension is about one-tenth of a micron.

5. The method of claim 3, wherein the dielectric material between the interlaced first finger structures and second finger structures has a length of about fifty microns.

6. The method of claim 1, wherein the first electrode includes first finger structures and the second electrode includes second finger structures, and the first and second finger structures have a line width of about one-tenth of a micron.

7. The method of claim 1, wherein the first electrode includes first finger structures and the second electrode includes second finger structures, and the first and second finger structures have a length of about fifty microns.

8. The method of claim 1, wherein the first electrode and the second electrode are formed of copper.

9. The method of claim 1, wherein the first electrode and the second electrode each include a pad measuring about fifty microns by about fifty microns.

10. The method of claim 1, wherein the first electrode includes first finger structures and the second electrode includes second finger structures, and the first and second finger structures are straight.

11. The method of claim 1, wherein the first electrode includes first finger structures and the second electrode includes second finger structures, and the first and second finger structures zigzag.

12. The method of claim 1, wherein the first electrode includes multiple first electrodes connected by a first bus, and the second electrode includes multiple second electrodes connected by a second bus that is separate from the first bus.

13. The method of claim 1, wherein the first electrode and the second electrode each include solid pads.

14. The method of claim 1, wherein the first electrode and the second electrode each include slotted pads.

15. The method of claim 1, wherein the first, second, third, and fourth voltage measurements each comprise a plurality of voltage measurements that are averaged to produce values that are used for $V_1$, $V_2$, $V_3$, and $V_4$.

16. The method of claim 1, wherein the first and second charges are each applied using a non-contact corona-based method.

17. The method of claim 1, wherein the first and second charges are each applied using a non-contact electron beam-based method.

18. The method of claim 1, wherein the first and second charges are each applied using a non-contact ion beam-based method.

19. The method of claim 1, wherein the first and second charges are each applied using a contact-based method.

20. The method of claim 1, wherein the first, second, third, and fourth voltages are each measured using a non-contact corona-based method.

21. The method of claim 1, wherein the first, second, third, and fourth voltages are each measured using a contact-based method.

22. The method of claim 1, wherein the first, second, third, and fourth voltages are each measured at a frequency of from about zero megahertz to about one megahertz.

23. The method of claim 1, wherein the first, second, third, and fourth voltages are each measured using a work function sensor that is at least one of a Kelvin probe, a Monroe probe, an electrostatic force probe, and an atomic force measurement probe.

24. The method of claim 1, wherein the dielectric material is at least one of silicon oxide, silicon nitride, silicon carbide, metal oxide, carbon doped oxide, porous ultra-low-k film, spin-on polymer low-k film, SiLk, nanoglass, and MSQ low-k films.

25. A method for determining an in-plane effective capacitance of a dielectric material, the method comprising the steps of:

forming first and second symmetrical electrodes entirely within a field of the dielectric material, where the first electrode, the second electrode, and the field of the dielectric material are co-planar, neither the first electrode nor the second electrode are either electrically connected to ground or to each other, applying a first charge Q on the first electrode, measuring a first voltage change $V_1$ on the first electrode, measuring a second voltage change $V_2$ on the second electrode, calculating a ground capacitance $C_g$ by, $$C_g=Q/(V_1+V_2), \text{ and}$$

calculating an inter-electrode capacitance $C_{ie}$ by, $$C_{ie}=V_2 Q/(V_1^2-V_2^2).$$

* * * * *